United States Patent
Hou et al.

(10) Patent No.: US 6,677,172 B1
(45) Date of Patent: Jan. 13, 2004

(54) ON-WAFER BURN-IN OF SEMICONDUCTOR DEVICES USING THERMAL ROLLOVER

(75) Inventors: Hong Q. Hou, Albuquerque, NM (US); Charlie X. Wang, Albuquerque, NM (US); Wenlin Luo, Albuquerque, NM (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 10/186,375

(22) Filed: Jun. 27, 2002

(51) Int. Cl.[7] .............................................. H01L 31/26
(52) U.S. Cl. .......................................... 438/17; 438/14
(58) Field of Search ........................ 438/14–18; 257/48

(56) References Cited

U.S. PATENT DOCUMENTS

| | | | |
|---|---|---|---|
| 6,574,763 B1 * | 6/2003 | Bertin et al. | 714/738 |
| 2002/0048826 A1 * | 4/2002 | Richmond et al. | 438/14 |
| 2003/0090288 A1 * | 5/2003 | Nakata et al. | 324/765 |

OTHER PUBLICATIONS

D.L. Smith, D.K. Fork, R.L. Thornton, A.S. Alimonda, C.L. Chua, C. Dunnrowicz and J. Ho; Flip Chip Bonding on 6um Pitch Using Thin–Film Microspring Technology; 1998 Electronic Components and Technology Conference; 325–329;, Xerox Palo Alto Research Center, Palo Alto, CA.

W.L. Ivy Jr., P. Godavarti, N. Alizy, T. McKenzie, and D. Mitchell; Sacrificial Metal Wafer Level Burn–In KGD; 2000 Electronic Components and Technology Conference; 535–540; Motorola Incorporated, Chandler, AZ.

D.R. Conti and J. Van Horn; Wafer Level Burn–In; 2000 Electronic Components and Technology Conference; 815–821; IBM Microelectronic Division, Essex Junction, VT.

* cited by examiner

*Primary Examiner*—Cuong Nguyen
(74) *Attorney, Agent, or Firm*—White & Case LLP

(57) ABSTRACT

Apparatus and method for on-wafer burn-in of a semiconductor device. In a preferred embodiment, the present invention is realized using an auto-prober commonly used in scan-testing of semiconductor devices. Specifically, in one embodiment, the auto-prober is programmed to sequentially apply an elevated current to each semiconductor device on a wafer. During the application of the elevated current, which substantially exceeds the normal operating current of the device, performance characteristics of the device, including its output power, is detected and registered. Preferably, each device is subjected to multiple scans by the elevated current. The device's performance characteristics is then analyzed. If a device exhibits consistent power output over different scans, it is not likely to suffer from infant mortality. If the device exhibits a shift in power output over successive scans, the device is likely to run into early failure and should be rejected. The multiple scans by the elevated current also stabilize device performance, avoiding further shift when the device is used in normal operation. Significantly, the present invention utilizes existing testing equipment to implement on-wafer burn-in and does not require an extended burn-in period, thereby providing an easily implemented and cost-effective method and system for on-wafer burn-in not achievable in prior art approaches.

22 Claims, 3 Drawing Sheets

ON-WAFER BURN-IN OF SEMICONDUCTOR DEVICES USING THERMAL ROLLOVER

FIELD OF THE INVENTION

The present invention relates to semiconductor device processing technology, and in particular, to a method for burning-in semiconductor devices that enables greatly reduced burn-in time and substantial energy cost savings.

DESCRIPTION OF THE RELATED ART

Semiconductor fabrication typically involves numerous process steps. Defects or other imperfections may be introduced to a chip at any of these process steps. If they remain undetected, such defects and imperfections are likely to result in the failure of the affected chip. To avoid chip failures due to such manufacturing defects or imperfections during the operating life of a chip, semiconductor manufactures rigorously test their finished chips before shipment to weed out any chips that are likely to fail as a result of manufacturing defects and imperfections that occur during the fabrication process.

"Burn-in" is a commonly-used procedure in semiconductor fabrication for stress testing semiconductor chips. The burn-in process allows the chip manufacturer to screen out defective chips as well as stabilizes the performance of the serviceable chips over their lifetime. The burn-in process generally involves operating the chips at elevated currents (e.g., about 2 to 5 times higher than the normal operating current) and temperatures (e.g., at ambient temperatures of about 50 to 100° C. higher than normal operating condition) for extended periods (e.g., up to 72 hours). During the burn-in process, chips prone to early failure are identified and eliminated. As such, the burn-in process greatly minimizes the problem of "infant mortality" in semiconductor devices. Moreover, it is known in the art that the operating parameters of semiconductor devices may shift during the early stage of its serviceable life. By burning-in the devices before shipment, so that any shifts in the chips' operating parameters occur by the end of the burn-in process, the chip manufacturer can deliver devices with stable and reliable performance to its customers.

Generally, when all process steps have been performed on a semiconductor wafer, the processed wafer is cut into individual dies. Each die is then encapsulated in a package typically made of metal, plastic or ceramic to produce a finished integrated circuit (IC) device or chip. Traditionally, burn-in is performed individually on each packaged device at this point in the manufacturing cycle. This approach is time-consuming because the burn-in process is performed chip-by-chip in serial fashion. It is also costly because a chip is not tested—and thus any defect is not detected—until the chip has been packaged. As such, costs for chip packaging material as well as for the packaging process are wasted on defective chips that must be discarded. In optoelectronic devices such as VCSEL (vertical cavity surface emitting laser) devices, it is common that the chip itself costs approximately 10 to 20 percent of the total raw material costs. This means that the costs for the packaging material (e.g., optical elements, TO (transistor outline) cans, etc.) and packaging process account for 80 to 90 percent of the entire packaged VCSEL device. Thus, it is highly desirable to have a mechanism whereby the chips are tested, and defective chips are rejected, before they are packaged such that costs for packaging raw material and packaging process are not unnecessarily incurred.

In light of the shortcomings of burning-in individual packaged devices, there have been recent efforts to perform the burn-in process on-wafer, i.e., before the processed semiconductor wafer is cut into individual dies. On-wafer burn-in allows the manufacturer to avoid the costs of packaging defective dies because they are identified and discarded before the packaging process begins. Currently, there are several approaches for conducting on-wafer burn-in. These different approaches are briefly discussed immediately below.

Some manufacturers use a "sacrificial wafer" approach to perform on-wafer burn-in. See, e.g., Wilburn L. Ivy, Prasad Godvarti, et al., "Sacrificial Metal Wafer Level Burn-In KGD", 50$^{th}$ Electronic Components & Technology Conference, Paper S15P2, May 2000. In this approach, a sacrificial wafer, which is fitted with microscopic metal contacts for all of its dies, is placed on top of a target wafer so that the corresponding dies on the two wafers are properly aligned. The burn-in process is then performed on both wafers simultaneously by applying the appropriate elevated current to the sacrificial wafer from a current source. Although the dies on the target wafer have no metal contacts of their own for direct coupling to the current source, these dies on the target wafer receive the elevated current by way of the metal contacts of the dies on the sacrificial wafer. At the end of the burn-in process, both the sacrificial wafer and the target wafer are burnt-in as intended. The sacrificial wafer is removed from the target wafer, which can then be cut into individual dies and packaged for delivery.

Another approach to on-wafer burn-in makes use of a so-called "microprobe wafer." See, e.g., D. L. Smith, D. K. Fork, R. L. Thornton, A. S. Alimonda, C. L. Chua, C. Dunnrowicz, and J. Ho, "Flip-Chip Bonding on 6-μm Pitch Using Thin-Film Microspring Technology", Proceedings of the 48$^{th}$ Electronics Components & Technology Conference, Seattle, Wash., May 1998, pp. 325–329. This wafer comprises two metal films of different strengths such that micro-tips are formed at proper locations on the wafer surface when one of the films is lifted out due to the strength differential. The resulting wafer with these micro-tips can then be placed on top of a target wafer and used as an array of microprobes for burn-in purposes, in a fashion similarly to that described above with respect to the sacrificial wafer approach. This microprobe wafer approach is particularly suited for burning-in high density wafers where precise electrical contacts with each and every individual device on the wafer is relatively more difficult to achieve using conventional approaches.

Yet another approach to on-wafer burn-in involves the use of a "conducting fabric." A fabric with well-controlled pH is placed on top of the target wafer to ensure that proper electrical contact is established for each die on the wafer so that burn-in of all dies can be accomplished. Still another approach involves using an elaborate probe card designed especially for the purposes of performing burn-in. See, e.g., Dennis R. Conti and Jody Van Horn, "Wafer Level Burn-In", 50$^{th}$ Electronic Components & Technology Conference, Paper S21P4, May 2000. The probe card comprises numerous probes for contacting all devices on a wafer. The card is placed in contact with the target wafer to allow all devices on the wafer to be burnt-in in a single burn-in cycle. In most cases, such probe cards are expensive to manufacture and a particular probe card may be useful for only a limited number of wafers as dictated by the device layout. A further approach is to temporarily wire all of the devices on the wafer (in series or in parallel) to form a complete circuit (e.g., by way of a bus line). See, e.g., Conti and Van Horn, ibid. As such, the interconnected devices on the wafer can all be burnt-in by applying a burn-in current to a small number of contacts (e.g., two contacts). When the burn-in is completed, the wafer is diced into individual dies and in the process the temporary interconnections between dies are severed.

There is a significant commonality among all of the above-described on-wafer burn-in approaches: they all involve burning-in each and every device on a given wafer at the same time during one burn-in cycle. Unfortunately, these approaches require that a large burn-in current be maintained for the entire duration of the burn-in process. This translates to a significant level of power consumption for an extended period of time. As an example, in the fabrication of VCSEL devices, a typical 3-inch wafer can include 25,000 individual devices. Assuming a typical burn-in current of 10 mA (milliamperes) per device, a current of 250 A (amperes) needs to be maintained over a period of two to three days (48 to 72 hours) in order to fully burn-in all 25,000 VCSEL devices on the wafer. Such continuous high current requirements (and thus high power consumption) are costly, and add difficulties for burn-in temperature control. Therefore, it would be advantageous to provide a reliable burn-in mechanism that does not have high power consumption requirements for an extended period.

In addition, a burn-in mechanism needs to be compatible with existing process steps and process flow such that its implementation does not require extensive overhaul or retrofitting of existing process and/or equipment.

Accordingly, the present invention provides a method and system which delivers a highly reliable on-wafer burn-in mechanism for treating semiconductor devices before the wafer is diced into individual dies. Embodiments of the present invention utilize existing testing equipment that is already in common use by semiconductor manufacturers to perform the burn-in process. Moreover, these embodiments require no extensive retrofitting of existing testing equipment to implement the burn-in process of the present invention. Furthermore, embodiments of the present invention are fully compatible with existing semiconductor process steps and process flow and do not require modifications to fabrication processes. Embodiments of the present invention, which utilize and leverage upon a conventional device testing procedure to perform on-wafer burn-in, are described in detail herein.

SUMMARY OF THE INVENTION

A preferred embodiment of the present invention provides a method for on-wafer burn-in using thermal rollover by way of an auto-prober. In this embodiment, the auto-prober is programmed to apply an elevated current to each semiconductor device on a wafer. The devices are processed in serial fashion, rather than all at once as is the case in the prior art. The magnitude of the elevated current substantially exceeds the normal operating current of the device, such that the device is subjected to thermal rollover during the process. The auto-prober detects and registers the performance characteristics of the device when the elevated current is being applied. In particular, the relationship of the output power to the input current is monitored. Preferably, each device is subjected to multiple scans by the elevated current. The device's performance characteristics, including the power-current relationship, is then analyzed to determine if the device is defective. If a device exhibits consistent power output over different scans, it is not likely to suffer from infant mortality. If the device exhibits a substantial amount of shift in power output over successive scans, the device is likely to run into early failure and should be rejected. Thus, the present invention provides an easily implemented and cost-effective method and system for on-wafer burn-in by leveraging upon existing testing equipment to implement on-wafer burn-in with the thermal rollover technique. Significantly, the present invention involves a minimal burn-in period, affording the chip manufacturer substantial savings both in time and in energy costs.

DESCRIPTION OF THE DRAWINGS

The accompanying drawings, which are incorporated in and constitute a part of this specification, illustrate several embodiments of the invention and, together with the description, serves to explain the principles of the invention.

DETAILED DESCRIPTION OF PREFERRED EMBODIMENTS

The present invention now will be described more fully with reference to the accompanying drawings, in which aspects of the preferred embodiments of the invention are shown. The present invention may, however, be embodied in many different forms and should not be construed as being limited to the embodiments set forth herein; rather these embodiments are provided so that this disclosure will be thorough and complete and will fully convey the invention to those skilled in the art. Indeed, the invention is intended to cover alternatives, modifications and equivalents of these embodiments, which will be included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details. In other instances, well known methods, procedures, components, and circuits have not been described in detail as not to unnecessarily obscure aspects of the present invention.

Embodiments of the present invention utilize existing testing equipment that is already in common use by semiconductor manufacturers to implement the burn-in process. As such, the procedure performed by such testing equipment is first described below. It is appreciated that semiconductor manufactures often conduct a full on-wafer scan test for each and every device on a wafer before the wafer is cut into individual dies. This scan test is conducted, in part, to determine the performance characteristics of the devices. For VCSEL devices, such performance characteristics typically include, for example, how the output power of the device varies with the input current applied to the device, and the relationship between the current and the voltage across the device. These performance characteristics of the devices as identified by the scan test define the operating parameters of those devices.

Figure 1:
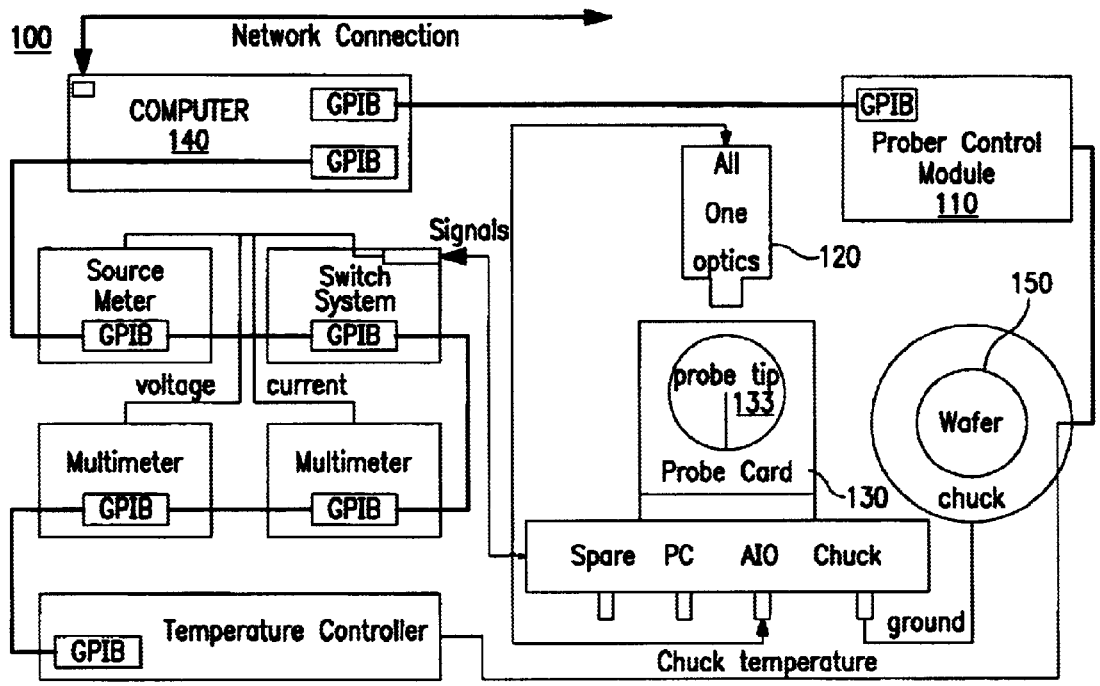
FIG. 1 is a block diagram of a typical auto-prober that is set up for VCSEL on-wafer measurement in accordance with one embodiment of the present invention.

Generally, an on-wafer scan test is carried out with a highly automated machine called an auto-prober. FIG. 1 is a block diagram of a typical auto-prober 100 that is set up for VCSEL on-wafer measurement in accordance with one embodiment of the present invention. As shown in FIG. 1, auto-prober 100 typically includes a high-precision microprobe (comprising a probe control module 110, precision optics 120, a probe card 130 having a probe tip 133) that is programmed (e.g., via computer 140) to make brief contact with the contact pads of a semiconductor device on a wafer 150. Auto-prober 100 automatically and systematically positions its microprobe tip 133 to contact each and every device on wafer 150 one after the other in serial fashion. During the brief and timed contact with each device on wafer 150, auto-prober 100 applies an electric current of a predetermined peak magnitude via the probe tip 133 to the device. The microprobe is equipped with sensors and detectors to capture data that reflects the performance characteristics of the device during the application of the current. The application of a current to the device under test and the capture of its performance data is commonly referred to as a scan. The captured data is stored and/or processed by auto-prober 100. The processed data is then reviewed to determine whether a particular device should be accepted or rejected. Since each scan generally takes only 20 milliseconds (ms) or less to complete, all devices on the entire wafer can be scan-tested in a relatively short period of time.

Figure 2:
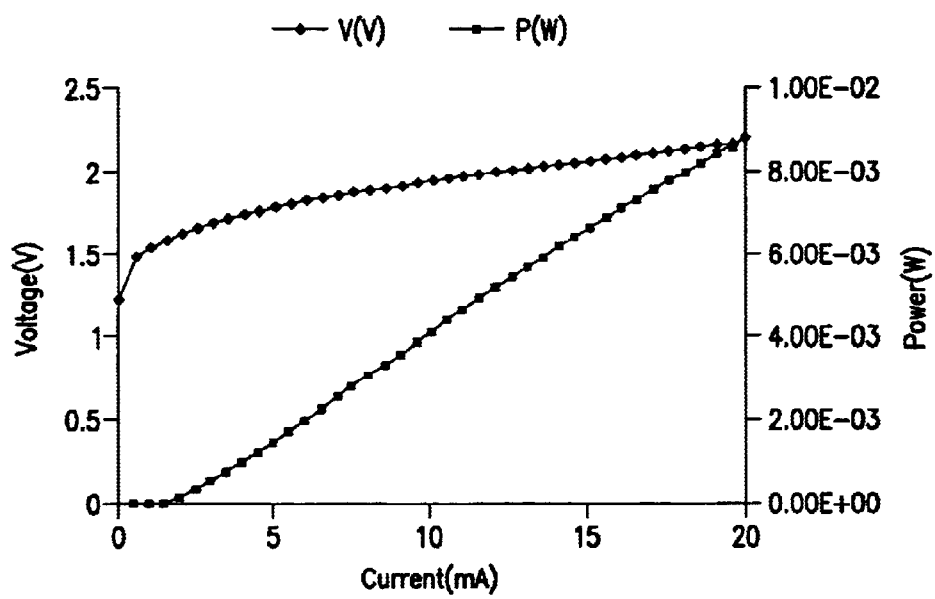
FIG. 2 illustrates the relationship between the output power (P) and input current (I) as well as the current-voltage (I–V) characteristics of a typical VCSEL device.

Auto-probers, such as auto-prober 100 of FIG. 1, are programmable, usually by way of a software module (e.g., stored in computer 140), so that the semiconductor manufacturer can adjust the testing conditions and parameters to values that are appropriate for the semiconductor devices that are being tested. A typical combination of testing parameters used for VCSEL devices includes applying a peak current of 10 to 20 mA to the device for about 15 ms. As an example, FIG. 2 illustrates the relationship between the output power (P) and input current (I) as well as the current-voltage (I–V) characteristics of a typical VCSEL device as captured by an auto-prober. As shown in FIG. 2, the current applied reaches a maximum at approximately 20 mA. Initially, the voltage (V) rises rapidly as the magnitude of the input current (I) is increased, but flattens out rather soon despite further increase in input current. In contrast, the output power (P) remains essentially zero until the input current (I) reaches a specific value (approx. 1.5 to 2.0 mA as illustrated in FIG. 2), then rises steadily with increasing input current as it approaches the peak value of 20 mA.

Figure 3:
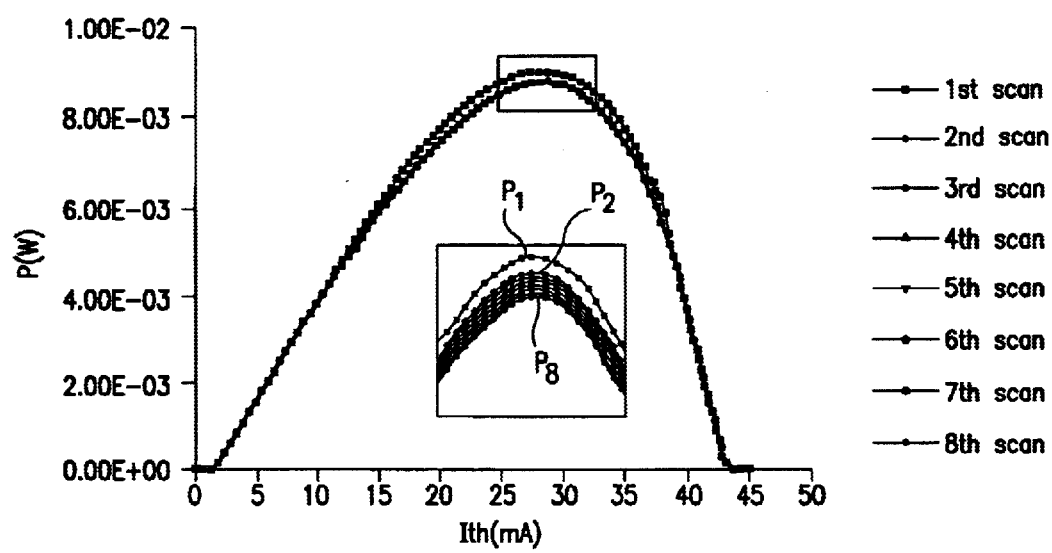
FIG. 3 illustrates the relationship between the output power (P) and input current (I) of a defective VCSEL device exhibited in successive scans using the process in accordance with one embodiment of the present invention.
Figure 4:
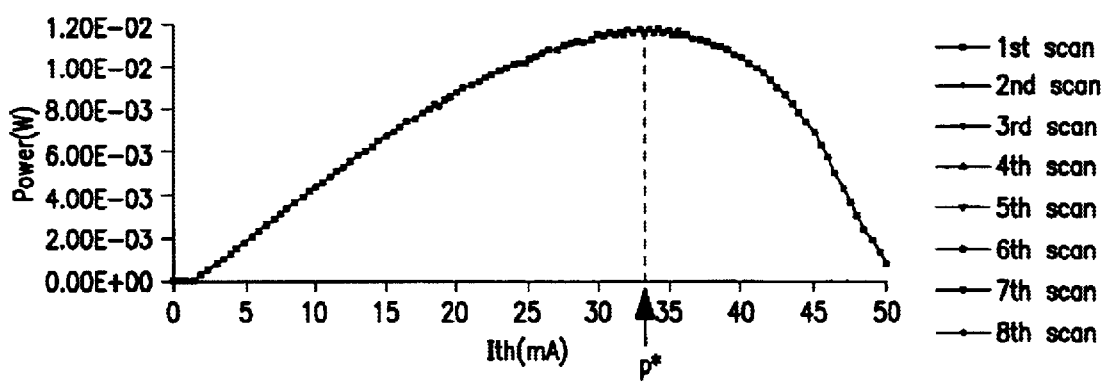
FIG. 4 illustrates the relationship between the output power (P) and input current (I) of a typical VCSEL device exhibited in successive scans using the process in accordance with one embodiment of the present invention.

Realizing that an auto-prober can be easily programmed to deliver not only a scan-test current but also a burn-in current of higher magnitude to semiconductor devices on-wafer, embodiments of the present invention provide a highly efficient and reliable method for burning-in semiconductor devices on-wafer (before the wafer is cut into individual dies) using the technique of thermal rollover. This technique essentially involves driving the device with a current that is much higher that its maximum operating current and at an elevated ambient temperature. Under these conditions, the internal temperature of the device being treated rises significantly above the normal operating temperature. When a certain threshold is reached, the elevated driving current and temperature will cause a typical VCSEL device to stop lasing (i.e., output power falls off dramatically). However, this is not a catastrophic effect that will induce permanent damage to the device. It is simply because the significant increase of the internal temperature of the VCSEL device (junction temperature) due to the current increase causes the cavity resonance peak to move out of the range of optical gain in the device. So, the optical gain for light amplification diminishes gradually as the device junction temperature increases beyond a certain limit. In other words, optical power output from the device will not increase with the current as it normally does when the current reaches a certain limit. Once the threshold current is exceeded, optical power output will drop or roll over and the device will eventually stop lasing, as shown in FIGS. 3 and 4 and described in greater detail below. When the driving current scans from zero to the roll-over level, the power-current curve of the device will repeat itself over the curve from the previous scan.

Significantly, in accordance with the present invention, by driving or scanning the device repeatedly and examining the performance characteristics exhibited by the device during the different scans, it can be easily and reliably determined whether the device is prone to infant mortality and thus should be rejected. More specifically, in a currently preferred embodiment, the technique of thermal rollover is used to burn-in VCSEL devices on-wafer. In this embodiment, an auto-prober is programmed to apply a current with a peak value of 50 mA with 0.5 mA increment step to each of the VCSEL devices on a wafer. This peak current is much higher than the normal operating current of the VCSEL device, which as discussed above is typically between 10 and 20 mA.

In accordance with the present invention, various types of scans can be implemented to conduct the on-wafer burn-in of VCSEL wafers using the thermal rollover techniques described herein. In one embodiment, current sweeping is used to perform the scanning. In another embodiment, current pulsing is used instead. An additional embodiment implements multiple scan types and allows the user to select which scan type to use in a particular instance. Current sweeping simulates an actual LIV scan with gradual current increase from zero to the maximum roll-over current. In contrast, current pulsing generates a square-shaped current pulse with the peak current that has a magnitude equivalent to the roll-over current. Within the scope of the present invention, both types of scans utilize the same equipment but different control software programs that are stored in a control computer.

It should be appreciated that in current sweeping scan mode, the number of scans and the maximum current can be adjusted accordingly to accommodate different devices. In addition to these two adjustable parameters, current pulsing mode also allows changes of pulse duration as well as time separation between pulses (or scans) to further customize the scan for burning in different devices.

In a preferred embodiment of the present invention, the auto-prober performs 5 scans on each VCSEL device on the wafer. During each scan that spans the 50 mA current range, the auto-prober captures relevant data about the performance characteristics of the device. Within the scope of the present invention, a VCSEL device that is not prone to early failure will exhibit consistent performance characteristics over the multiple scans. For example, the output power of the device will rise to the same peak value in every scan as the input current is increased and then drops off as the input current exceeds the same threshold value. In contrast, a VCSEL device that is prone to infant mortality will exhibit varying performance characteristics over the multiple scans. In particular, in each successive scan, a defective device will not attain the same peak power output reached in previous scan(s) as the input current rises to the threshold value. In essence, a VCSEL device that is likely to fail early will exhibit deteriorating output power performance over successive scans. Using this performance distinction as a screening criterion, devices that are tend to fail early are affirmatively identified and rejected in accordance with the present invention.

FIGS. 3 and 4 illustrate the relationship between the output power (P) and input current (I) of two VCSEL devices as captured by an auto-prober. Referring first to FIG. 3, the relationship between the output power (P) and input current (I) of a defective VCSEL device as exhibited in successive thermal rollover scans using the process in accordance with one embodiment of the present invention is shown. FIG. 3 shows 8 different P-I curves for the 8 scans of the device. These P-I curves indicates that the device exhibits a maximum power output $P_1$ during the first scan, $P_2$ during the second scan, and so on. The peak power output attained by the device in each scan is lower than that reached in the immediately preceding scan (i.e., $P_1 > P_2 > P_3 > P_4 > P_5 > P_6 > P_7 > P_8$). In accordance with invention, this device is prone to infant mortality and should be rejected as defective. Care must be taken to avoid overstressing the VCSEL devices, which will damage the devices and cause a large portion of the devices to deteriorate.

Referring next to FIG. 4, the relationship between the output power (P) and input current (I) of a typical VCSEL device as exhibited in successive thermal rollover scans using the process in accordance with one embodiment of the present invention is shown. FIG. 4 shows 8 overlapping P-I curves for the 8 scans of the device. In other words, the device exhibits the same maximum power output P* during all 8 scans. The device consistently outputs the same peak power in each scan. In accordance with the present invention, this device is not prone to infant mortality and is suitable for shipment.

Figure 5:
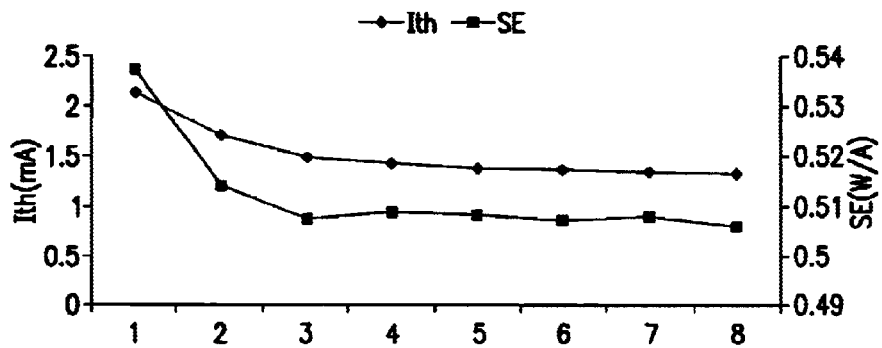
FIG. 5 illustrates changes in the laser threshold current ($I_{th}$) and the slope efficiency (SE) of a typical VCSEL device exhibited in successive scans using the process in accordance with one embodiment of the present invention.

In addition to infant mortality screening, the burn-in process of the present invention will also stabilize VCSEL performance. Certain performance characteristics of a freshly fabricated VCSEL device, such as the laser threshold current ($I_{th}$) and the slope efficiency (SE), will shift during the initial period of operation before they settle down and stay unchanged for the rest of the device's useful life. Significantly, the on-wafer burn-in process in accordance with the present invention will stabilize the performance of the device in just a few scans. Thus, the present invention greatly shortens the stabilization period which can take up to 72 hours under some of the prior art burn-in approaches described above. Referring to FIG. 5 as an example, changes in $I_{th}$ and SE of a typical VCSEL device exhibited in successive scans using the process in accordance with one embodiment of the present invention are shown. As FIG. 5 illustrates, $I_{th}$ and SE stabilize after the first 4 scans of the burn-in process, staying essentially unchanged from the $5^{th}$ scan onward.

In an embodiment where the dwell time for each step is 15 ms and 4 scans to 50 mA are performed on each device, burn-in time per device using thermal rollover is approximately 6 seconds. For a wafer having 25,000 VCSEL devices, the time needed for burning-in all devices takes a total time of a little over forty hour. By processing the devices on a wafer in this sequential fashion, rather than attempting to treat every device on the wafer all at once as in the prior art, the present invention effectively shortens the time period required to burn-in semiconductor devices on-wafer. Moreover, due to the significantly shorter processing time, the present invention also greatly reduces the power consumption required for the on-wafer burn-in of the devices as compared to prior art approaches that seek to burn-in each and every device on a given wafer simultaneously through a 3-day burn-in marathon with a sustained level of high power consumption as described above. The reduction in power consumption affords substantial energy cost savings to the semiconductor manufacturer.

Using embodiments of the present invention, devices that are prone to early failures can be reliably detected using on-wafer testing equipment. These devices can thus be tagged and eliminated from the batch before shipment, thereby enabling the chip manufacturer to ship "known good dies" (KGD) to its customers. In other words, using embodiments of the present invention imparts a high degree of confidence to the chip manufacturer with respect to the quality and reliability of shipped devices. By performing thermal rollover burn-in and thus weeding out defective devices before they are packaged, embodiments of the present invention also enable the chip manufacturer to avoid any wastes incurred in packaging defective dies, which wastes are inherent in prior art approaches where burn-in is not performed until after the device is packaged. Moreover, since embodiments of the present invention are easily implemented by simply reprogramming an auto-prober that is generally in widespread use by semiconductor manufacturers, no extensive retrofitting of existing testing equipment is required to practice the on-wafer burn-in process of the present invention. Furthermore, embodiments of the present invention are fully compatible with existing semiconductor process steps and process flow and do not require modifications to fabrication processes. In sum, embodiments of the present invention utilize and leverage upon a conventional device testing procedure to perform on-wafer burn-in which entails a much shorter burn-in time and results in significant costs savings in reduced energy consumption as well as avoided wastes in packaging defective devices.

It should be appreciated that in accordance with the present invention, there are several key parameters that can be adjusted to adapt the on-wafer burn-in process for different classes of semiconductor devices, or devices having different performance specifications within the same class. These parameters include: the current ramp rate (how rapidly the magnitude of the input current is increased during a scan), the number of scan per device, the dwell time (the duration of a step at a certain current), the peak value of the input current, and ambient temperature. Each class of device generally has its own optimal parametric combination that can be determined empirically. Caution should be used not to apply excessive current or temperature lest the devices being tested be damaged.

While the currently preferred embodiments of the present invention are best suited for burning-in and stress-testing VCSEL devices, the present invention is not limited thereto. Rather, having read the description herein, it would be clear to those skilled in the art that the process parameters and other aspects of the present invention as discussed herein can be readily adjusted for use in the on-wafer burn-in of different categories of semiconductor devices. Moreover, while the description herein focuses on burning-in semiconductor devices on the wafer one at a time, this is not a requirement or limitation of the present invention. While it is undesirable to attempt to burn-in a large number of devices simultaneously (e.g., every single device on a wafer all at once) due to the large current required, it is within the scope and spirit of the present invention to implement a burn-in scheme wherein more than one device is being burnt-in at a given time. For instance, certain components, such as VCSEL arrays, consist of multiple devices by design. In this case, it may be desirable to perform the burn-in for all of the 10 or 12 devices that make up the VCSEL array within the scope of the present invention.

It should be appreciated that the details of the scanning algorithm of the auto-prober is well-adapted to numerous implementations within the scope of the present invention. In an embodiment where each semiconductor device on the wafer is to be scanned multiple times, the auto-prober can be programmed to scan the same device repeatedly until the predetermined number of scans per device has been completed before moving on to the next device. Alternatively, the auto-prober can be programmed to scan each device on the wafer once and then proceed immediately to the next device. When every device on the wafer has been scanned once, the auto-prober repeats the process of scanning each device once again. The is repeated until all devices on the wafer have received the requisite number of scans. Other implementation details of on-wafer burn-in using the thermal rollover technique, while not explicitly described herein, are intended to be within the scope and spirit of the present invention.

Figure 6:
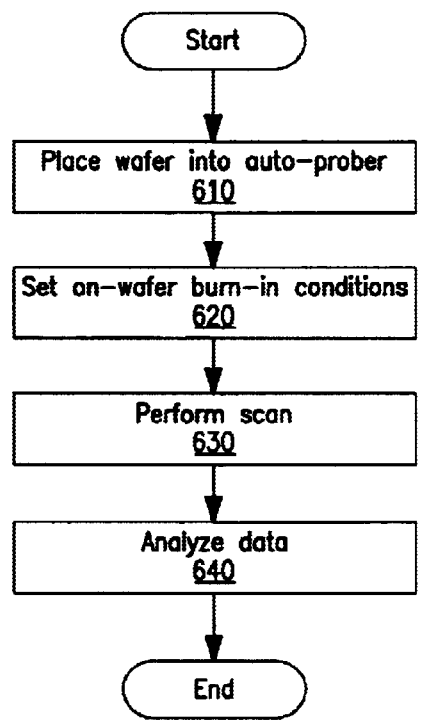
FIG. 6 is a flow diagram illustrating steps of a burn-in process using thermal rollover in accordance with one embodiment of the present invention.

Referring next to FIG. 6, a flow diagram 600 illustrating steps of a burn-in process using thermal rollover in accordance with one embodiment of the present invention is shown. In step 610, a processed wafer with devices to be burnt-in thereon is placed into an auto-prober. In a preferred embodiment, auto-prober 100 of FIG. 1 is used to implement the on-wafer burn-in process of VCSEL devices.

In step 620, the on-wafer burn-in conditions, such as the parameters as described above (e.g., current ramp rate, number of scan per device, dwell time, peak input current, ambient temperature), are set according to the class and performance specifications of the devices being treated. In accordance with a currently preferred embodiment of the present invention, these conditions can be set either manually by an operator or automatically by the auto-prober based on a pre-programmed recipe.

In step 630, the devices are scanned by the auto-prober. As described above, any of various types of scans, such as current sweeping and current pulsing, or a combination thereof can be used as appropriate for the particular kind of devices being treated. In one embodiment, an appropriate burn-in current is applied to the devices and data reflecting the performance characteristics of the devices being scanned are captured by the auto-prober.

In step 640, the data captured by the auto-prober in step 630 is analyzed to determine which of the devices on the wafer are suitable for shipment and which ones should be rejected. In accordance with a preferred embodiment, the data analysis can be performed either programmatically by the auto-prober or manually by an operator.

While preferred embodiments of the present invention, a method and system for on-wafer burn-in of a semiconductor device using thermal rollover, have been described, it is understood that those skilled in the art, both now and in the future, may make various improvements and enhancements which fall within the scope of the claims that follow. These claims should be construed to maintain the proper protection for the invention first disclosed herein.

What is claimed is:

1. A method for on-wafer burn-in of a semiconductor device on a wafer, the semiconductor device having a normal operating current and a normal operating temperature, the method comprising the steps of:

(a) applying a scan current to the semiconductor device under a predetermined ambient temperature;

(b) registering performance characteristics of the semiconductor device during the application of the scan current thereto; and (c) determining whether the semiconductor device is prone to infant mortality based on the performance characteristics registered in said step (b);

wherein the scan current is higher than the normal operating current of the semiconductor device and the predetermined ambient temperature is higher than the normal operating temperature of the semiconductor device, and wherein the performance of the semiconductor device is stabilized by the application of the scan current.

2. The method as recited in claim 1, wherein the semiconductor device is a vertical cavity surface emitting laser (VCSEL) device.

3. The method as recited in claim 1, wherein said steps (a) and (b) are repeated for a predetermined number of times and wherein said determination in said step (c) is based on a comparison of the performance characteristics of the semiconductor device registered in said repetitions of said step (b).

4. The method as recited in claim 1, wherein the wafer comprises a plurality of said semiconductor device and wherein said steps (a), (b) and (c) are repeated for each of said plurality of said semiconductor device on the wafer.

5. The method as recited in claim 4, wherein said steps (a) and (b) are performed on said plurality of said semiconductor device one at a time in serial fashion.

6. The method as recited in claim 4, wherein said steps (a) and (b) are performed on a subset of said plurality of said semiconductor device simultaneously, and wherein said subset includes more than one but not all of said plurality of said semiconductor device on the wafer.

7. The method as recited in claim 1, wherein the scan current is applied to the semiconductor device for as long as 20 milliseconds (ms).

8. The method as recited in claim 1, wherein the scan current is substantially higher than 20 milliamperes (mA).

9. The method as recited in claim 1, wherein the scan current is as high as 50 milliamperes (mA).

10. The method as recited in claim 1, wherein the scan current is applied using a current sweeping mode.

11. The method as recited in claim 1, wherein the scan current is applied using a current pulsing mode.

12. The method as recited in claim 1, wherein the scan current is applied via an auto-prober.

13. A method for stabilizing the performance of a semiconductor device on a wafer, the semiconductor device having a normal operating current and a normal operating temperature, the method comprising the step (a) of:

repeatedly applying a scan current to the semiconductor device under a predetermined ambient temperature, wherein the scan current is higher than the normal operating current of the semiconductor device and the predetermined ambient temperature is higher than the normal operating temperature of the semiconductor device, until the performance of the semiconductor device is stabilized.

14. The method as recited in claim 13, wherein the semiconductor device is a vertical cavity surface emitting laser (VCSEL) device.

15. The method as recited in claim 13, wherein the wafer comprises a plurality of said semiconductor device and wherein said step (a) is performed on each of said plurality of said semiconductor device on the wafer.

16. The method as recited in claim 15, wherein said step (a) is performed on said plurality of said semiconductor device one at a time in serial fashion.

17. The method as recited in claim 15, wherein said step (a) is performed on a subset of said plurality of said semiconductor device simultaneously, and wherein said subset includes more than one but not all of said plurality of said semiconductor device on the wafer.

18. The method as recited in claim 13, wherein the scan current is applied to the semiconductor device for as long as 20 milliseconds (ms).

19. The method as recited in claim 13, wherein the scan current is substantially higher than 20 milliamperes (mA).

20. The method as recited in claim 13, wherein the scan current is applied using a current sweeping mode.

21. The method as recited in claim 13, wherein the scan current is applied using a current pulsing mode.

22. The method as recited in claim 13, wherein the scan current is applied via an auto-prober.

* * * * *